United States Patent
Schneider et al.

(10) Patent No.: US 10,208,488 B2
(45) Date of Patent: Feb. 19, 2019

(54) PROCESSING FACILITY FOR MANUFACTURING INTEGRATED CIRCUITS FROM SEMICONDUCTOR WAFERS AS WELL AS PERFORATED PANEL FOR A PROCESSING FACILITY

(71) Applicant: M+W Group GmbH, Stuttgart (DE)

(72) Inventors: Hartmut Schneider, Stuttgart (DE); Freyja Eberle, Remseck-Aldingen (DE); Steffen Köhler, Vaihingen an der Enz (DE); Peter Csatary, Ditzingen (DE); Herbert Blaschitz, Leonberg (DE)

(73) Assignee: M+W Group GmbH, Stuttgart (DE)

( * ) Notice: Subject to any disclaimer, the term of this patent is extended or adjusted under 35 U.S.C. 154(b) by 0 days.

(21) Appl. No.: 15/264,655

(22) Filed: Sep. 14, 2016

(65) Prior Publication Data

US 2017/0073978 A1    Mar. 16, 2017

(30) Foreign Application Priority Data

Sep. 14, 2015 (DE) .................. 10 2015 012 053

(51) Int. Cl.
| | |
|---|---|
| *F24F 7/10* | (2006.01) |
| *E04F 15/02* | (2006.01) |
| *G03F 7/20* | (2006.01) |
| *E04H 5/02* | (2006.01) |
| *H01L 21/67* | (2006.01) |

(Continued)

(52) U.S. Cl.
CPC ......... *E04F 15/02177* (2013.01); *E04H 5/02* (2013.01); *G03F 7/702* (2013.01); *G03F 7/708* (2013.01); *G03F 7/70991* (2013.01); *E04B 5/43* (2013.01); *E04B 5/48* (2013.01); *E04F 2290/02* (2013.01); *H01L 21/67225* (2013.01)

(58) Field of Classification Search
CPC .......... F24F 3/161; F24F 2221/40; F24F 7/10; H01L 21/67017; H01L 21/67178; H01S 3/0903; E04B 5/43; E04F 15/02405; G03F 7/70; G03F 7/70033
See application file for complete search history.

(56) References Cited

U.S. PATENT DOCUMENTS

| | | | |
|---|---|---|---|
| 5,058,491 A | 10/1991 | Wiemer et al. | |
| 5,096,477 A * | 3/1992 | Shinoda ................. | F24F 3/161 454/187 |

(Continued)

*Primary Examiner* — Brian E Glessner
*Assistant Examiner* — Daniel J Kenny
(74) *Attorney, Agent, or Firm* — Gudrun E. Huckett

(57) ABSTRACT

A processing facility for manufacturing integrated circuits on semiconductor wafers is provided with at least one radiation generator that generates an EUV (extreme ultra-violet) radiation that is supplied to at least one lithography machine, housed in a factory building, for exposure of the semiconductor wafers. The radiation generator is housed in a building or a building section separate from the factory building. At least one beam guide extends from the building or the building section to the factory building, wherein the EUV radiation is supplied from the building or the building section through the at least one beam guide to the factory building. At least one supply line branches off at an obtuse angle from the at least one beam guide inside the factory building, wherein at least a portion of the EUV radiation is supplied through the at least one supply line to the lithography machine.

7 Claims, 4 Drawing Sheets

(51) Int. Cl.
    *E04B 5/48*     (2006.01)
    *E04B 5/43*     (2006.01)

(56) References Cited

U.S. PATENT DOCUMENTS

| | | | | |
|---|---|---|---|---|
| 5,928,077 | A * | 7/1999 | Kisakibaru | F24F 3/161 |
| | | | | 414/940 |
| 6,306,189 | B1 * | 10/2001 | Renz | F24F 3/161 |
| | | | | 454/187 |
| 6,574,937 | B1 * | 6/2003 | Rapisarda | E04B 5/43 |
| | | | | 52/126.6 |
| 6,592,450 | B1 * | 7/2003 | Kim | E04F 15/02405 |
| | | | | 454/187 |
| 6,869,457 | B2 * | 3/2005 | Nakagawa | F24F 3/161 |
| | | | | 414/217 |
| 6,910,497 | B2 * | 6/2005 | Bernard | H01L 21/67017 |
| | | | | 118/715 |
| 7,997,897 | B2 * | 8/2011 | Miyata | F23G 7/06 |
| | | | | 266/144 |
| 9,161,426 | B2 * | 10/2015 | Patra | G03F 7/70008 |
| 9,853,412 | B2 * | 12/2017 | Nikipelov | H01S 3/0903 |
| 2002/0092249 | A1 | 7/2002 | Yin | |
| 2008/0239303 | A1 * | 10/2008 | McDaniel | G01N 21/954 |
| | | | | 356/241.1 |
| 2008/0259303 | A1 | 10/2008 | Ossmann et al. | |
| 2015/0137012 | A1 * | 5/2015 | Patra | G03F 7/70008 |
| | | | | 250/504 R |
| 2016/0225477 | A1 | 8/2016 | Banine et al. | |
| 2016/0252823 | A1 | 9/2016 | Patra et al. | |

\* cited by examiner

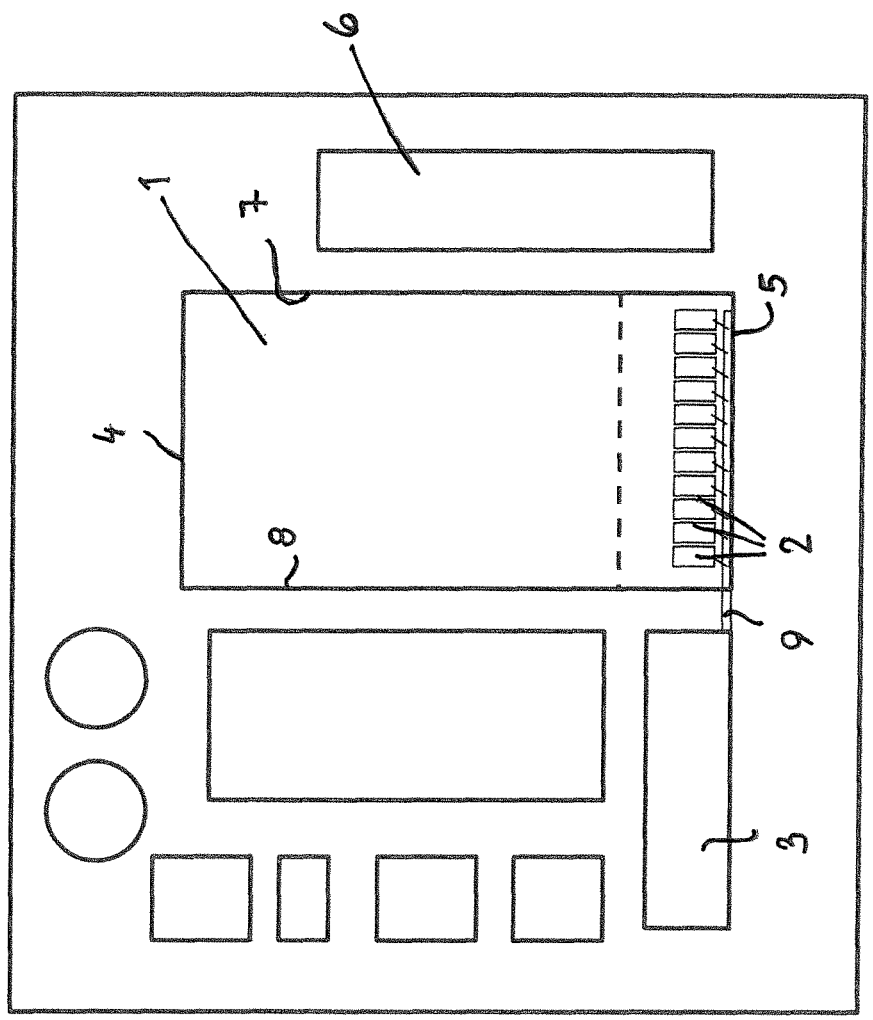

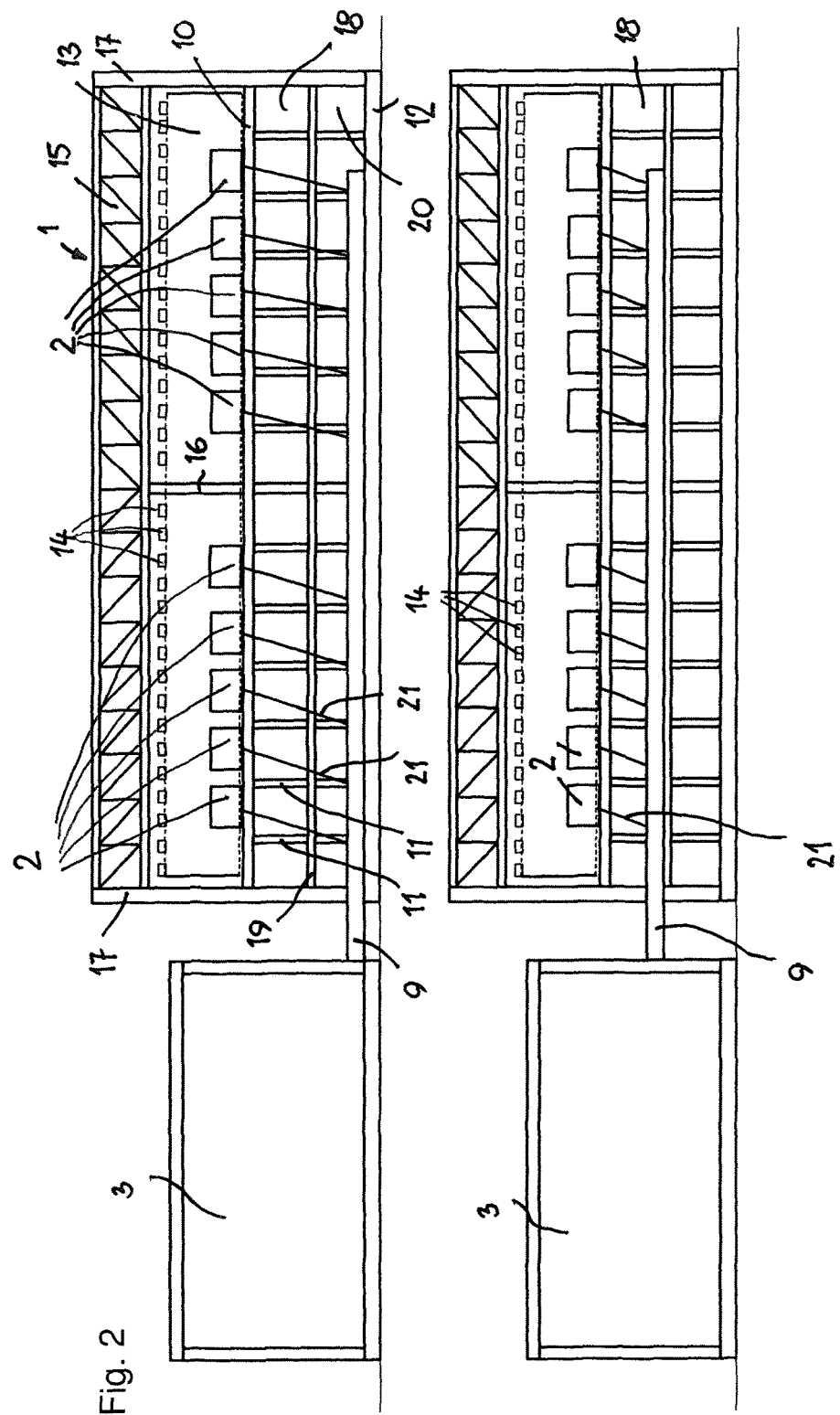

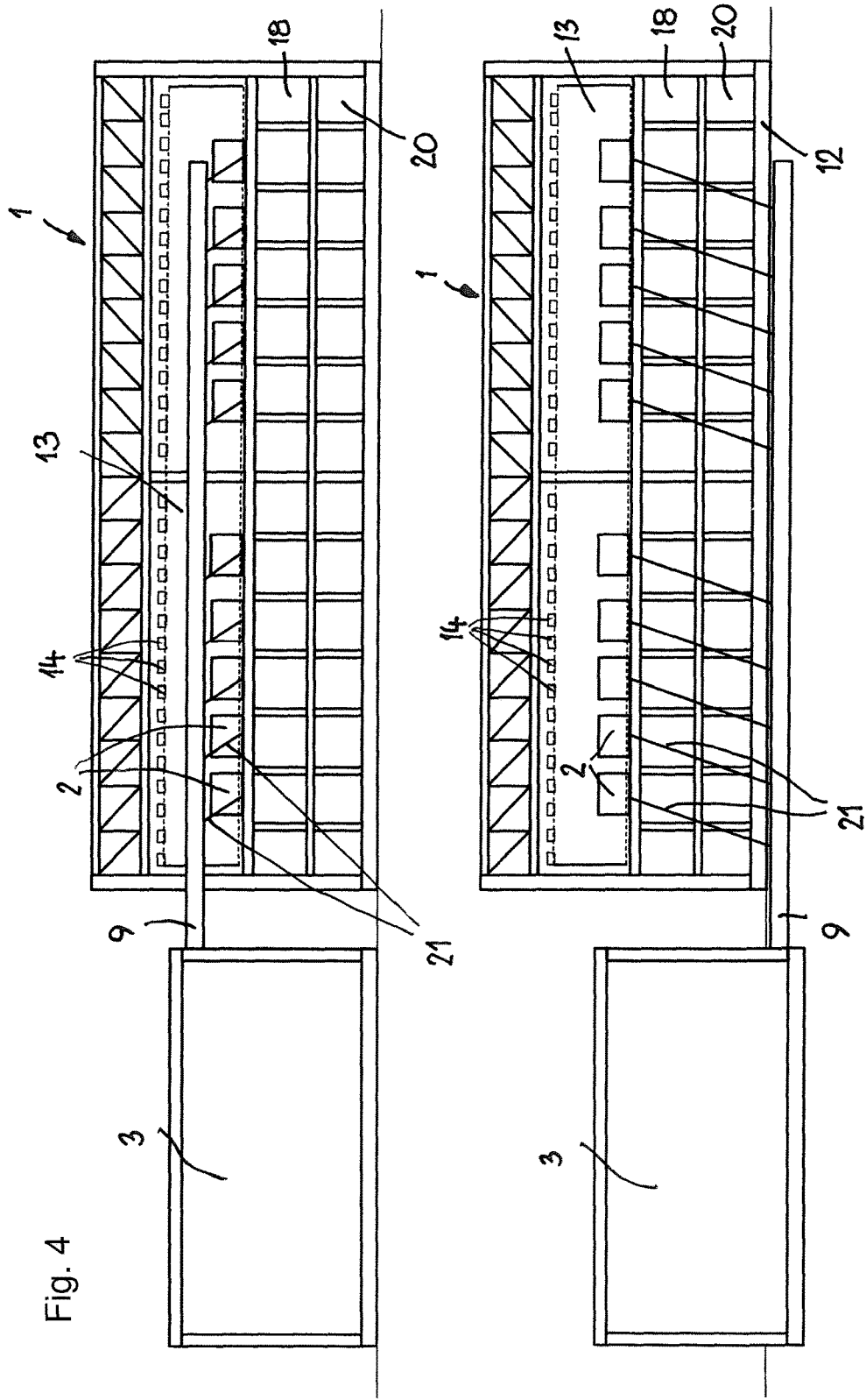

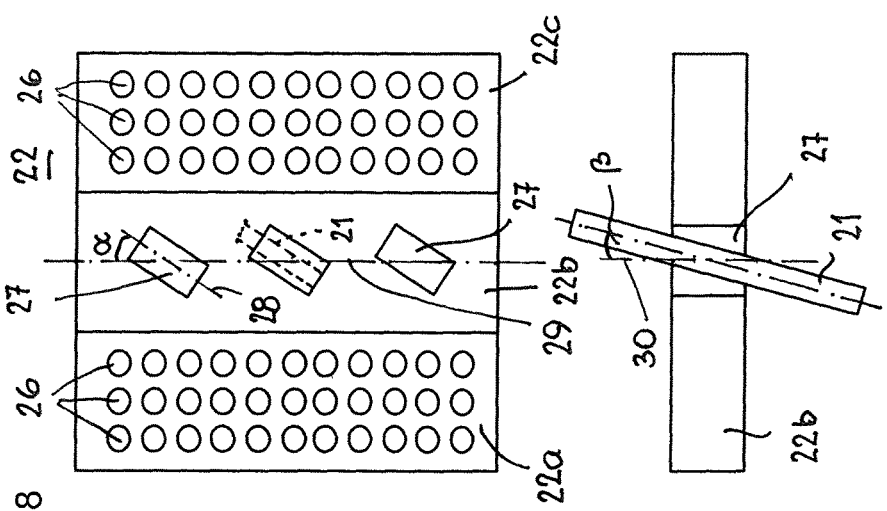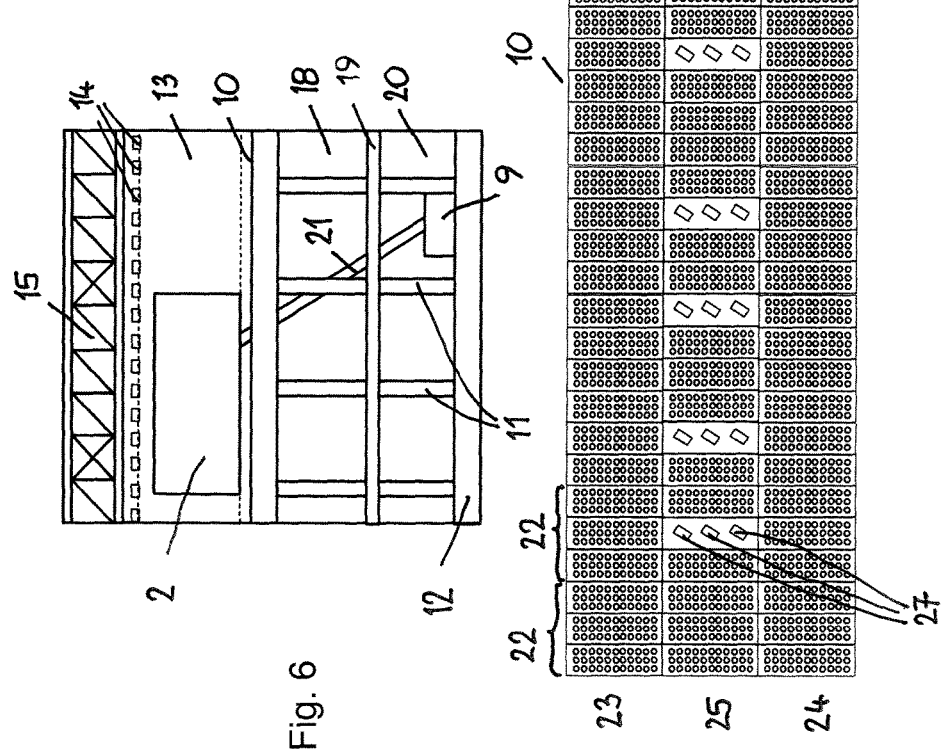

PROCESSING FACILITY FOR MANUFACTURING INTEGRATED CIRCUITS FROM SEMICONDUCTOR WAFERS AS WELL AS PERFORATED PANEL FOR A PROCESSING FACILITY

BACKGROUND OF THE INVENTION

The invention concerns a processing facility for manufacturing integrated circuits (chips) on wafers as well as a perforated panel for a processing facility.

When manufacturing chips, wafers are used which are exposed to EUV radiation (extreme ultraviolet). This EUV radiation has only a very minimal wavelength so that chips with very small structural widths can be produced. The EUV radiation is released when plasmas are generated by focusing laser beams on tin droplets. This EUV radiation is supplied to the lithography machines by means of which the wafers are exposed in the manufacture of the chips. The lithography machines are located in a factory building.

The invention has the object to embody the processing facility of the aforementioned kind as well as the perforated panel of the aforementioned kind in such a way that the supply of the EUV radiation to the lithography machine can be designed to be inexpensive and simple.

SUMMARY OF THE INVENTION

This object is solved for the processing facility of the aforementioned kind in accordance with the invention with the characterizing features of the independent claim and for the perforated panel of the aforementioned kind in accordance with the invention with the characterizing features as disclosed.

In the processing facility according to the invention, the radiation generator generating the EUV radiation is located in a building, or a building section, that is separate from the factory building. The generated EUV radiation is supplied by at least one beam guide to the factory building. In order to supply the EUV radiation to the lithography machine within the factory building, at least one supply line branches off the beam guide and extends to the lithography machine at an obtuse angle. Since the radiation generator is not located in the factory building, no special features of the factory building have to be taken into consideration when constructing it. Therefore, the building or the building section containing the radiation generator can be erected optimally in regard to the available space within the premises of the processing facility. The beam guide is a vacuum tube in which the EUV radiation is propagated. The vacuum ensures that the EUV rays are not absorbed or only insignificantly absorbed. Coupling out the EUV radiation from the beam guide into the supply line is realized at an obtuse angle by means of optical beam splitters.

The lithography machine is advantageously housed in a clean room of the multi-story factory building so that the exposure of the wafer can be performed reliably. The stories above and/or below the clean room are advantageously utilized for supply and discharge of clean air as well as for supply and removal of media. The floor between clean room and the story underneath is configured as a perforated panel floor.

A simple supply of the EUV radiation results when the beam guide is advantageously extending in the area below the lithography machine in the factory building. The area above the lithography machine is then available, for example, for transportation devices with which the lithography machine parts and material can be transported.

In the clean room there are advantageously several lithography machines which are preferably arranged in a row adjacent to each other.

When the processing facility is newly constructed, it is expedient to provide the beam guide in such a way that it is extending below the floor slab of the processing building. The beam guide can then be optimally installed with respect to technical construction measures, considerations in regard to the premises and the like. The interior of the factory building is then free from the beam guide so that the factory building can be utilized optimally.

When the factory building is already existing, then it is advantageous when the beam guide is installed in a story of the factory building below or above the clean room. From here, the appropriate supply lines can then be easily extended to the lithography machine(s).

In order not to impair by vibrations the EUV radiation that is supplied from the beam guide and/or the supply line and its optical elements, the beam guide is preferably guided in the area of the staff entrance into the factory building. In the area of the staff entrance, shocks that would have a disadvantageous effect on the EUV radiation in the beam guide are not occurring or occurring with negligible effects.

Advantageously, the material access is then located on the side of the factory building which is opposite the staff entrance. In the area of the material access generally greater vibrations occur that are caused, for example, by transportation vehicles and the like which however have no disadvantageous effect on the EUV radiation due to the great distance from the beam guide.

When the beam guide is located in the area below the lithography machine, the supply line extends then preferably through a passage in a perforated floor of the clean room.

Preferably, the perforated floor of the clean room is formed by perforated panels. They constitute pre-manufactured components which, for forming the perforated floor, are placed next to each other and are connected fixedly to each other.

The perforated panel is provided with at least one, preferably several passages for the supply line. The supply line can therefore be guided in a very simple way through the perforated floor from below to the lithography machine which is standing on the perforated floor. When the perforated panel has in a preferred way several passages, the supply line can then be guided through the best suited passage into the clean room.

Advantageously, the passage has a rectangular contour. Accordingly, the passage can have a sufficiently large contour so that the supply lines can be passed through without problems.

The perforated panel has advantageously a quadrangular contour so that the perforated floor can be assembled very simply from the perforated panels.

Since the supply line is branching off at an obtuse angle from the beam guide, the passage is designed such that it is positioned at an acute angle at a slant to the center plane of the perforated panel. Since the passage advantageously has a rectangular contour, the passage can be provided in the perforated panel in such a way that the supply line can extend at a slant through the perforated panel.

The supply line is positioned relative to the center plane of the perforated panel advantageously also at an acute angle.

The perforated panel according to the invention is designed such that the passage for the supply line comprises a rectangular contour and is positioned at an acute angle relative to a center plane of the perforated panel, viewed in a plan view of the perforated panel. As a result of the rectangular configuration of the passage, it can be selected to be so large that, depending on the magnitude of the acute angle, the supply line can be guided through the passage at a slant.

Preferably, the passage is located centrally within the perforated panel.

In a preferred embodiment, the perforated panel has at least two adjacently positioned sections of which one section comprises the passage for the supply line and the other section comprises through openings for clean air. The perforated panel in this case is provided with two different passages. Accordingly, in an advantageous way it is thus not necessary to employ different perforated panels for the different passages.

The sections of the perforated panel have advantageously the same contour and advantageously also the same thickness and fulfill the load and vibration specifications of the other perforated panels.

The object of the invention results not only from the subject matter of the individual patent claims but also from the disclosures and features disclosed in the drawings and the description. They are claimed to be essential for the invention, even when they are not the subject matter of the claims, inasmuch as individually or in combination they are novel relative to the prior art.

Further features of the invention result from the additional claims, the description, and the drawings.

BRIEF DESCRIPTION OF THE DRAWINGS

The invention will be explained in more detail with the aid of embodiments illustrated in the drawings. It is shown in:

FIG. 1 in schematic illustration and in plan view the map of a processing facility according to the invention for manufacturing integrated circuits on semiconductor wafers;

FIG. 2 in schematic illustration and in a side view an embodiment of a processing facility according to the invention;

FIG. 3 in schematic illustration and in a side view a further embodiment of a processing facility according to the invention;

FIG. 4 in schematic illustration and in a side view a further embodiment of a processing facility according to the invention;

FIG. 5 in schematic illustration and in a side view a further embodiment of a processing facility according to the invention;

FIG. 6 in an end view the embodiment according to FIG. 2;

FIG. 7 a plan view of a floor of the processing facility according to the invention comprised of perforated panels;

FIG. 8 in an enlarged illustration and in plan view a perforated panel;

FIG. 9 in schematic illustration the extension of a beam guide through the perforated panel according to FIG. 8.

DESCRIPTION OF THE PREFERRED EMBODIMENTS

When manufacturing integrated circuits or components (chips) on wafers, lithography machines are used with which the wafers are exposed in a known manner.

FIG. 1 shows in schematic illustration a conventional facility for manufacturing chips on wafers. The facility comprises a building 1 in which the chips are manufactured. For this purpose, wafers are used which are exposed on the lithography machines 2 in a known way. Since this method is known, it will only be briefly described in the following. A photoresist is applied to the wafer and subsequently exposed. After the exposure process, the wafer is developed. For exposing the wafer, a synchrotron radiation is used which is generated by means of an FEL (free electron laser). This laser is designed such that it can generate radiation in the X-ray range. Such lasers are referred to as FEL or as X-ray laser. With it, extremely energy-rich laser light with a wavelengths of 0.05 to approximately 30 nm can be generated. On the wafer, very fine and narrow structures can be produced by exposure to such a radiation.

The X-ray laser FEL which is required for generating this X-radiation is housed in a building 3 which is located adjacent to the building 1.

The factory building 1 is preferably designed such that a material access side 4 is spatially separated from a staff entrance side 5. In the illustrated preferred embodiment, the processing building 1 has an approximately rectangular contour. In this case, the material access side 4 and the staff entrance side 5 are provided on the two narrow sides of the factory building 1. The personnel themselves are housed in an administrative building 6 which is adjacent to a longitudinal side 7 of the factory building 1.

Adjacent to the oppositely positioned longitudinal side 8 of the factory building 1, there are, for example, utility buildings as well as storage buildings which are not identified in detail in FIG. 1.

Since the FEL building 3 is located adjacent to the factory building 1, the X-radiation generated by the X-ray laser must be supplied through at least one beam guide 9 to the lithography machines 2. In FIG. 1, the beam guide 9 is schematically illustrated.

FIG. 2 shows an exemplary configuration of the factory building 1. The lithography machines 2 are located on a floor 10 which is supported by supports 11 on the foundation 12. The lithography machines 2 are located in a clean room 13 which fulfills the prescribed clean room conditions for exposure of the wafer. The clean room 13 is delimited in the ceiling area by filter fan units 14 which are illustrated in FIG. 2 only schematically. The filter fan units 14 are designed in a known way and guide the clean air in downward direction into the clean room 13. The floor 10 of the clean room 13 is provided with through openings for the clean air which, after passing through the openings in the floor 10, is returned to the filter fan units 14 in a known way. In this context, the clean air can be air-conditioned as well as, if need be, also heated. This treatment of the clean air is known and is therefore not disclosed here in detail.

Above the filter fan units 14, there is a support structure 15 along which, for example, a transport crane or the like can be moved with which, for example, the lithography machines 2 can be transported. The support structure 15 is provided with corresponding rails along which the crane can be moved. The support structure 15 as well as the filter fan units 14 arranged underneath are supported by supports 16 and walls 17 in a suitable way on the foundation 12.

Below the floor 10 of the clean room 13, there is a basement story 18 with a floor 19. It separates the basement story 18 from a further basement story 20 arranged underneath which, as a floor, may comprise the foundation 12 or an additional floor. Within the basement story 18 there are the supports 11 which are advantageously also uniformly distributed across the surface of the floor 19 and support the floor 10 of the clean room 13. The supports 11 extend advantageously through the basement story 20 and support then the floor 19 on the foundation 12.

Since the X-ray laser is located in the building 3, the X-radiation generated by it must be supplied to the lithography machines 2 in the factory building 1. The device for generating the X-radiation has large dimensions, for example, a length dimension of approximately 100 m. Accordingly, the building 3 in which this radiation generation source is arranged must be correspondingly large. The X-radiation generated by the FEL is then guided through the at least one beam guide 9 out of the building 3. The beam guide 9 is a vacuum tube as is known in the art in which the X-radiation can be propagated. In the embodiment according to FIG. 2, the beam guide 9 is guided into the lower basement story 20. In this context, it is expedient when the beam guide 9 is fastened in immediate contact to the foundation 12 or an additional floor of the basement story 20. As can be seen in FIG. 6, the beam guide 9 is arranged such that with its one longitudinal side it is resting on the vertical supports 11.

Within the beam guide 9, the X-radiation is coupled out in a known way through optical devices into supply lines 21 extending at a slant upwardly by means of which the coupled-out proportion of the X-radiation is supplied to the lithography machines 2. One supply line 21 is provided for each radiation machine 2, respectively.

The supply lines 21 adjoin the beam guide 9 at an obtuse angle (FIG. 2).

The supplied X-ray light is then again coupled out at the respective machine 2 in a known way and is utilized for exposure of the wafer in the machine 2.

In a way to be still described, the floors 10, 19 are provided with passages through which the supply lines 21 are extending.

The beam guide 9 has such a length that the machines 2 which are positioned within the clean room 13 can be supplied through the supply lines 21 with the required X-radiation. Since the beam guide 9 extends straight, it is advantageous when the machines 2 are arranged in a row at a spacing adjacent to each other in the clean room 13. A simple radiation supply of this machine by means of the supply lines 21 is then possible.

Advantageously, the beam guide 9 is positioned in such a way in the basement story 20 that the basement story can still be utilized optimally for other purposes. For this reason, the beam guide 9 is installed close to one of the narrow sides of the factory building 1. As shown in FIG. 6, the area to the left next to the beam guide 9 can be used indeed for other purposes.

In the embodiment according to FIG. 3, the beam guide 9 is extended into the basement story 18. Here, the beam guide 9 can be positioned in the same way as in the basement story 20 in accordance with FIG. 2. Since the beam guide 9 has a shorter spacing to the lithography machines 2, the supply lines 21 can be designed correspondingly shorter. This has the advantage that possibly occurring radiation losses can be kept lower. In other respects, the embodiment according to FIG. 3 is configured in the same way as the embodiment according to FIG. 2.

While in the embodiments according to FIGS. 2 and 3 the supply lines 21 are extending in the factory building 1 from below to the lithography machines 2, in the embodiment according to FIG. 4 the supply of the X-radiation to the lithography machines 2 is realized from above. The beam guide 9 is designed such that it is guided in the area above the lithography machines 2 into the clean room 13. Expediently, the beam guide 9 which is coming from the FEL building 3 is not arranged immediately above the machines 2 but, in accordance with the preceding embodiments, laterally displaced thereto. In this way, access to the machines 2 is not impaired. The supply lines 21 branch off the beam guide 9 at a slant in downward direction toward the individual machines 2. The supply lines 21 branch off in accordance with the preceding embodiment at an obtuse angle from the beam guide 9, viewed perpendicular to the radiation line (FIG. 4). Since the beam guide 9 is extending into the clean room 13, the supply lines 21 can be short which is advantageous with respect to possibly produced radiation losses.

In this embodiment, the basement stories 18, 20 are available completely for other tasks.

In other respects, this embodiment is of the same configuration as the preceding embodiments.

FIG. 5 shows the possibility of providing the beam guide 9 of the FEL building 3 in an area below the factory building 1 instead of extending it into the factory building 1. The beam guide 9 extends below the floor slab of the foundation 12. This configuration is advantageous when the factory building 1 as well as the FEL building 3 are constructed at the same time. The preceding embodiments are advantageous when the factory building 1 is already erected and the machines 2 contained therein are to be retrofitted and supplied with X-radiation.

The supply lines 21 from the beam guide 9 to the exposure machines 2 in the clean room 13, in contrast to the preceding embodiments, are longer because they must not only extend through the foundation 12 but also through the two basement stories 18, 20. The supply lines 21 adjoin again the beam guide 9.

The floors 10, 19 of the clean room 13 and of the basement 18 are provided with appropriate through openings for the supply lines 21.

Since the beam guide 9 is positioned below the floor slab 12, it can be optimally positioned such that the supply line 21 can be guided optimally to the machines 2.

With the aid of FIGS. 7 through 9, the extension of the supply lines 21 through the floor 10 of the clean room 13 will be explained in more detail. The floor 10 is formed by perforated panels 22 which are positioned in a grid pattern. A typical size of the perforated panel 22 is 7.2 m×7.2 m×1 m. Advantageously, each perforated panel 22 is comprised of three sections 22a, 22b, 22c. These sections have advantageously the same dimensions. For example, these sections each have a length of 7.2 m, a width of 2.4 m, and a height of 1 m.

FIG. 7 shows in a plan view the floor 10 which is assembled of perforated panels 22. In the embodiment, each perforated panel 22 is formed by three identical sections 22a to 22c. As is apparent from FIG. 7, the perforated panel sections within the perforated panel 22 can be of the same configuration. This is the case, for example, in the two longitudinal rows 23 and 24 of the floor 10. In the center row 25 of the floor 10, perforated panels 22 are provided whose sections are identically designed but also differently.

In principle, it is also possible that the perforated panel 22 is comprised of only one section.

The perforated panel 22 according to FIG. 8 is used in the floor 10 of the clean room at the location where the supply lines 21 are passing through to the machines 2. The perforated panel 22 has two identically designed sections 22a, 22c provided with through openings 26. They are advantageously arranged in rows adjacent and behind each other. The clean air which is flowing in the clean room 13 from top to bottom exits through these openings 26 in downward direction from the clean room 13. The through openings 26 have advantageously circular contour.

The central section 22b of the perforated panel 22 is provided with passages 27 for the supply lines 21. The passages 27 are positioned spaced apart form each other. They are identically designed and each have a rectangular contour. In the illustrated embodiment, the passages 27 are arranged such that their longitudinal axes 28 are positioned at an acute angle α to the longitudinal axis 29 of the section 22b, viewed in a plan view of the perforated panel 22. The slanted position of the passages 27 is designed such that the supply lines 21 in their slanted position relative to the beam guide 9 can be properly guided through the passages 27. As is shown in FIG. 9, the supply lines 21 are positioned at an angle β relative to the longitudinal center plane 30 of the section 22b containing the longitudinal axis 29. In FIG. 8, one of the supply lines 21 extending through the passage 27 is illustrated by dashed lines. In plan view of the perforated panel 22, the supply line 21 extends parallel to the longitudinal sides of the passages 27.

The passages 27 have such a cross-sectional shape that the clean air can flow through the passages 27 past the supply lines 21 in downward direction. In this context, the cross-section of the passages 27 is advantageously so large that in sum total of the passages provided within the central section 22b the same air quantity can flow through as through the passages 26 in the sections 22a or 22c.

Moreover, the perforated panel 22 is designed such that the stiffness of the perforated panel 22 despite the passages 27 fulfills the requirements with regard to vibration resistance and load carrying capacity.

The supply lines 21 that, like the beam guide 9, are in the form of the vacuum tubes are attached in a suitable way to the perforated panel 22 such that no vibrations from the perforated panel 22 or from the floor 10 of the clean room 13 are transmitted to the supply lines 21. In this way it is ensured that the exposure on the machines 2 is guaranteed with the required precision.

As is shown in FIG. 7, the passages 27 in the floor 10 of the clean room 13 are provided only at those locations where the supply lines 21 are extending upward from the basement story 18.

In principle, there is also the possibility to employ the individual sections 22a to 22c as separate parts so that the variability for designing the clean room floor 10 is increased. The sections 22b which are provided with the passages 27 for the supply lines 21 can then be arranged at any desired location within the clean room floor 10.

The perforated panels 22 or their individual sections are connected to each other in a known way such that the clean air can exit only through the passages 26 as well as the passages 27 in downward direction from the clean room 13.

What is claimed is:

1. A processing facility for manufacturing integrated circuits on semiconductor wafers, the processing facility comprising:

at least one radiation generator that generates an EUV (extreme ultraviolet) radiation that is supplied to at least one lithography machine, housed in a clean room of a factory building, for exposure of the semiconductor wafers;

wherein the at least one radiation generator is housed in a building or a building section, wherein the building or the building section is separate from the factory building;

at least one beam guide extending from the building or the building section to the factory building, wherein the EUV radiation is supplied from the building or the building section through the at least one beam guide to the factory building;

at least one supply line branching off at an obtuse angle from the at least one beam guide inside the factory building, wherein at least a portion of the EUV radiation is supplied through the at least one supply line to the lithography machine;

wherein the clean room comprises a perforated floor comprised of perforated panels, wherein the perforated panels each have a quadrangular contour, wherein the perforated panels include a passage-carrying perforated panel comprising a passage with a rectangular contour;

wherein the at least one supply line extends through the passage with the rectangular contour into the clean room;

wherein the passage-carrying perforated panel comprises a center plane oriented vertically relative to the perforated floor and wherein the passage with the rectangular contour has two parallel sides positioned at a slant relative to the center plane, when viewing the passage-carrying perforated panel in a plan view in a vertical direction relative to the perforated floor.

2. The processing facility according to claim 1, wherein the at least one beam guide is extending in a story of the factory building below or above the clean room.

3. The processing facility according to claim 1, wherein the at least one supply line extends at a slant relative to the center plane through the passage with the rectangular contour.

4. The processing facility according to claim 1, wherein the at least one beam guide is extending in an area below the at least one lithography machine in the factory building.

5. The processing facility according to claim 1, wherein the at least one beam guide is arranged in the area of a staff entrance of the factory building.

6. The processing facility according to claim 5, wherein a material access of the factory building is provided on a side of the factory building that is opposite the staff entrance.

7. The processing facility according to claim 1, wherein the at least one beam guide is arranged below a foundation of the factory building.

* * * * *